United States Patent
Reyes et al.

[11] Patent Number: 6,023,086
[45] Date of Patent: Feb. 8, 2000

[54] SEMICONDUCTOR TRANSISTOR WITH STABILIZING GATE ELECTRODE

[75] Inventors: Adolfo C. Reyes, Tempe; Marino J. Martinez, Phoenix; Ernest Schirmann, Phoenix; Julio C. Costa, Phoenix, all of Ariz.

[73] Assignee: Motorola, Inc., Schaumburg, Ill.

[21] Appl. No.: 08/926,078

[22] Filed: Sep. 2, 1997

[51] Int. Cl.⁷ .................................................. H01L 29/76

[52] U.S. Cl. ............................ 257/341; 257/287; 257/363; 257/401

[58] Field of Search ..................................... 438/330, 329, 438/167, 381, 382, 384, 385; 257/328, 329, 341, 363, 536, 537, 538, 750, 754, 755, 401, 153, 154, 453, 477, 364, 412, 449, 287

[56] References Cited

U.S. PATENT DOCUMENTS

| | | | |
|---|---|---|---|
| 4,194,174 | 3/1980 | DeLise | 257/537 |
| 4,290,185 | 9/1981 | McKenny et al. | 438/385 |
| 4,451,328 | 5/1984 | Dubois | 257/538 |
| 4,586,064 | 4/1986 | Esser et al. | 257/364 |
| 4,948,747 | 8/1990 | Pfiester | 438/384 |
| 5,221,639 | 6/1993 | White . | |
| 5,592,006 | 1/1997 | Merrill . | |
| 5,610,430 | 3/1997 | Yamashita et al. | 257/412 |

*Primary Examiner*—Sara Crane
*Attorney, Agent, or Firm*—Rennie William Dover

[57] ABSTRACT

A semiconductor device includes a transistor (30, 51) having a gate electrode (15, 52) wherein the gate electrode (15, 52) has a highly resistive portion (24, 25, 55). The highly resistive portion (24, 25, 55) is integrated into the gate electrode (15, 52) and is coupled to the gate electrode (15, 52) using a via-less contact method.

13 Claims, 2 Drawing Sheets

SEMICONDUCTOR TRANSISTOR WITH STABILIZING GATE ELECTRODE

BACKGROUND OF THE INVENTION

This invention relates, in general, to semiconductor devices, and more particularly, to resistors in semiconductor devices.

Many high performance field effect transistors (FETs) are unstable because of their very high power gain of approximately thirty to forty decibels at low operating frequencies of approximately ten kilohertz to four hundred megahertz. One technique for stabilizing high performance FETs uses an external resistor in series with the gates of the FETs. However, a circuit designer must remember to add the external resistor to the circuit, and the addition of the external resistor increases the size and cost of the electronic device using the high performance FETs. Other prior art stabilization techniques similarly increase the size, cost, and complexity of electronic devices that use high performance FETs.

Accordingly, a need exists for an improved high performance transistor that is stable even when operated at low frequencies. The transistor should be easily and inexpensively manufactured.

DETAILED DESCRIPTION OF THE DRAWINGS

Figure 1:
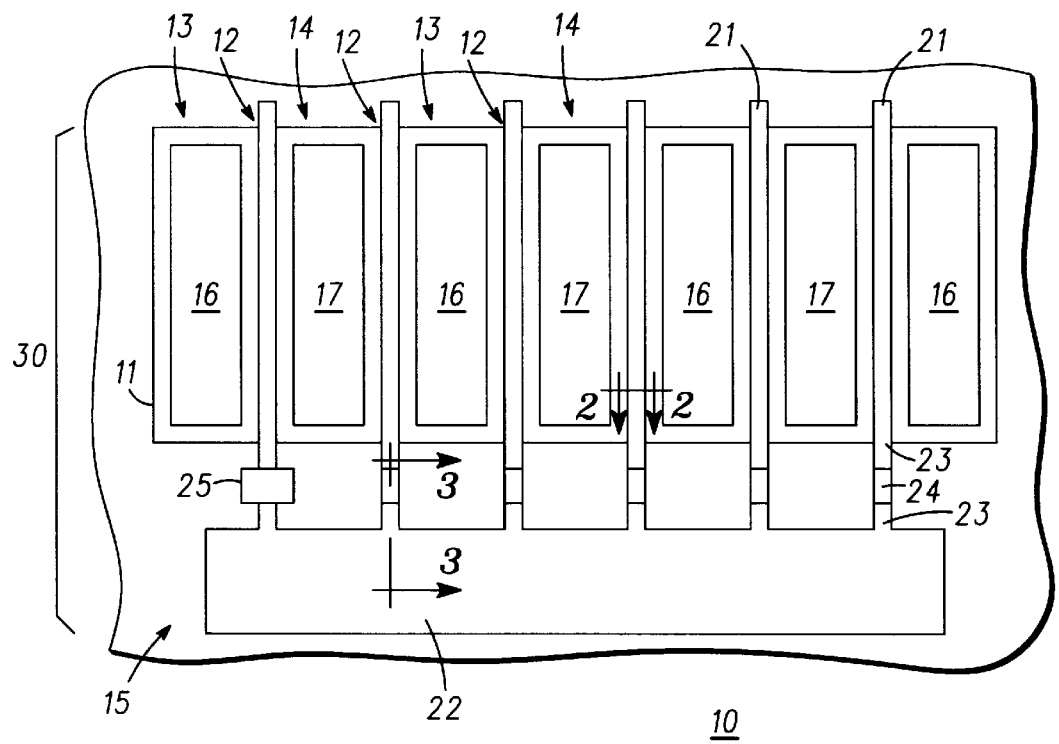
FIG. 1 illustrates a partial plan view of an embodiment of a semiconductor device after an intermediate stage of manufacturing in accordance with the present invention.

FIG. 1 illustrates a partial plan view of an electronic component or semiconductor device 10 after an intermediate stage of manufacturing. Device 10 can include an integrated circuit or the like, but at a minimum, device 10 includes a transistor 30, which is preferably a metal-semiconductor field effect transistor (MESFET). In an alternative embodiment, transistor 30 can be a different type of FET such as a metal-oxide-semiconductor field effect transistor (MOSFET) or the like. Transistor 30 includes an active area 11 that comprises channel regions 12 located between source regions 13 and drain regions 14. Source electrodes 16 and drain electrodes 17 are located over and are electrically coupled to source regions 13 and drain regions 14, respectively. Active area 11 and electrodes 16 and 17 are manufactured using semiconductor processing techniques known to those skilled in the art.

Transistor 30 also includes a gate electrode 15 overlying channel regions 12. Gate electrode 15 is preferably formed after source regions 13, drain regions 14, source electrodes 16, and drain electrodes 17. Gate electrode 15 includes gate fingers 21 and a gate feed network or gate bus 22. Each of fingers 21 are substantially parallel to each other, substantially perpendicular to bus 22, electrically coupled to bus 22, and electrically coupled to each other through bus 22. Each of fingers 21 are preferably identical to each other to provide even or uniform current flow throughout transistor 30 and to improve the reliability of transistor 30. Each of fingers 21 are located between adjacent source electrodes 16 and drain electrodes 17.

Each of fingers 21 include a portion 23 and a portion 24 wherein portion 24 is more resistive than portion 23. Accordingly, portion 24 is a resistor integrated into each of gate fingers 21. The resistance of each of gate fingers 21 is dominated by the resistance of portion 24 because portion 24 is much more resistive than portion 23. Therefore, the resistance of each of gate fingers 21 is approximately equal to the resistance of portion 24.

As a resistor, portion 24 improves the stability of transistor 30 without requiring additional space in a semiconductor substrate. Portion 24 preferably does not overlie channel regions 12 or any other portion of active area 11 to ensure even or uniform current flow across active area 11.

Portion 24 has the same width as portion 23. However, the more resistive portion of the gate finger can also have a larger or smaller width than portion 23. A wider resistor is portrayed as portion 25. The preferred width of the more resistive portion of the gate fingers depends on the desired resistance value of portions 24 and 25. The resistor should not be too long in order to conserve space and to reduce the cost of transistor 30. The preferred resistance values of portions 24 and 25 are approximately ten to fifty ohms.

Figure 2:
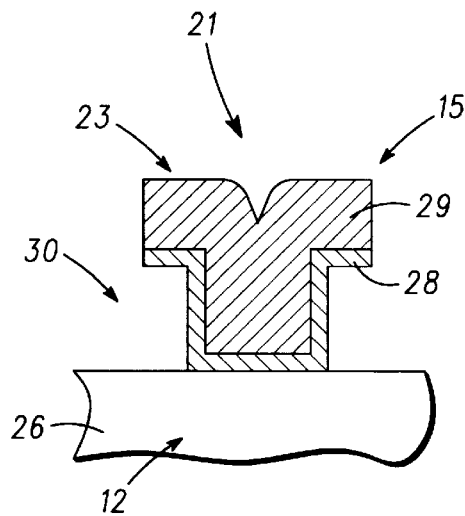
FIG. 2 portrays a cross-sectional view of the semiconductor device of FIG. 1 taken along a section line 2—2.

FIG. 2 portrays a cross-sectional view of device 10 taken along a section line 2—2 of FIG. 1. The same elements in FIGS. 1 and 2 are represented by the same element numbers. A semiconductor substrate 26 supports transistor 30 and device 10. Substrate 26 is comprised of a semiconductor material such as, for example, gallium arsenide or silicon. Channel regions 12 and other portions of transistor 30 can be formed in substrate 26 using etch or implant and anneal techniques known in the art. Portion 23 of gate fingers 21 overlies channel regions 12. The dielectric layer or layers overlying substrate 26 and underlying the outer portions of gate fingers 21 are not illustrated in FIG. 2 to simplify the explanation of device 10.

Portion 23 of gate fingers 21 includes layers 28 and 29, which are both electrically conductive layers. Layer 28 is preferably a Schottky barrier layer that forms a Schottky contact with substrate 26 when substrate 26 is comprised of gallium arsenide. In this preferred embodiment, layer 28 is preferably comprised of titanium, tungsten, or the like. As an example, layer 28 can consist essentially of tungsten nitride. Layer 29 is preferably a metal layer comprised of gold, aluminum, copper, or the like. Gold is preferred for layer 29 because the etch selectivity between aluminum copper and titanium is very poor.

In the preferred embodiment where layers 28 and 29 are comprised of titanium tungsten nitride and gold, respectively, layer 28 includes a top stratum consisting essentially of titanium wherein the top stratum physically contacts layer 29 to improve the adhesion between layers 28 and 29. Layers 28 and 29 physically contact each other such that a dielectric layer is preferably not disposed between or is preferably absent between all portions of layers 28 and 29. Accordingly, layers 28 and 29 are not coupled together through vias in a dielectric layer.

Figure 3:
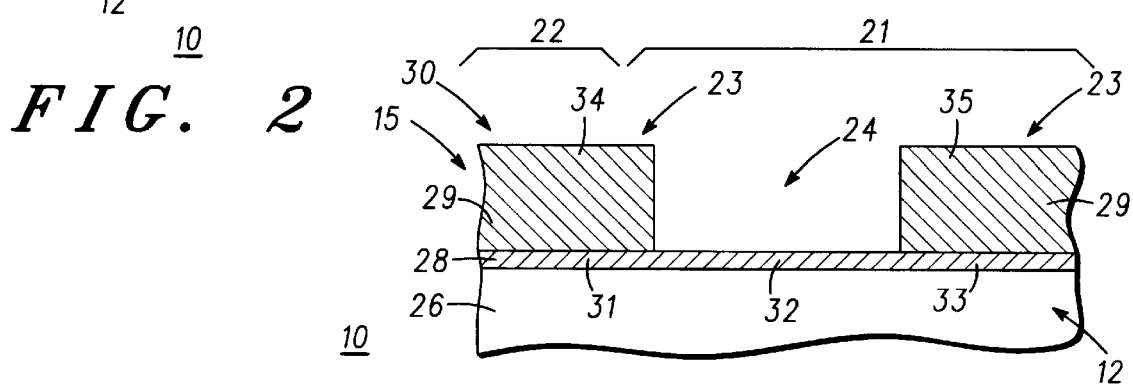
FIG. 3 portrays a cross-sectional view of the semiconductor device of FIG. 1 taken along a section line 3—3.

FIG. 3 portrays a cross-sectional view of device 10 taken along a section line 3—3 of FIG. 1. The same reference numerals are used in the figures to denote the same elements. Portions 23 and 24 of gate fingers 21 have different thicknesses. In particular, portion 24 of gate fingers 21 is thinner than portion 23 of gate fingers 21. Based on the following discussion, portion 23 is preferably about five to twenty times thicker than portion 24. Bus 22 is approximately the same thickness as portion 23 of gate fingers 21.

Bus 22 and gate fingers 21 are formed simultaneously with each other. First, layer 28 is disposed over the entire surface of substrate 26. In the preferred embodiment, layer 28 is deposited by using a sputter deposition process.

Next, layer 29 is disposed over layer 28. In the preferred embodiment, layer 29 is deposited by first sputter depositing a seed layer comprised of the same material as layer 29. This seed layer is deposited over the entire surface of substrate 26 and layer 28, including over portion 24 of gate fingers 21.

Then, a photoresist pattern (not shown) is formed over the seed layer to define where layer 29 should be plated over layer 28. The photoresist pattern is formed over portion 24 of gate fingers 21 such that layer 29 is not plated over portion 24 of gate fingers 21. The photoresist pattern is not formed over certain portions of layer 28 that form bus 22 and portion 23 of gate fingers 21 such that layer 29 can be plated on those certain portions of layer 28. After the plating process, the photoresist pattern is removed, and then the exposed seed layer is removed to reveal the underlying portions of layer 28, including portion 24 of gate fingers 21, that are not covered by the plated regions of layer 29. Commercially available etchants known to those skilled in the art can be used to selectively remove the exposed seed layer.

Next, a second photoresist pattern (not shown) is formed over portion 24 of gate fingers 21. This second photoresist pattern protects portion 24 of gate fingers 21 during the etching of the exposed portions of layer 28 that do not underlie the plated regions of layer 29. As an example, a sulfur hexafluoride based chemistry can be used to dry etch the exposed portions of layer 28. The second photoresist pattern does not have to be formed over layer 29 because of the high etch selectivity between layers 28 and 29. After the dry etching of layer 29, the second photoresist pattern is also removed.

As portrayed in FIG. 3, portion 24 of gate fingers 21 is comprised of portion 32 of layer 28 and is not comprised of layer 29. Portion 23 of gate fingers 21 and bus 22 are both comprised of layers 28 and 29. In particular, portion 23 of gate fingers 21 is comprised of portions 31 and 33 of layer 28 and portions 34 and 35 of layer 29. Bus 22 is comprised of portion 31 of layer 28 and portion 34 of layer 29. Portion 32 of layer 28 is adjacent to and electrically couples together portions 31 and 33 of layer 28. Portions 34 and 35 of layer 29 overlie portions 31 and 33, respectively, of layer 28 and are electrically coupled together through portion 32 of layer 28.

In the preferred embodiment, layer 28 is approximately 100 to 200 nanometers thick, has a resistivity of approximately $1 \times 10^{-4}$ to $5 \times 10^{-4}$ ohm-centimeters, and has a sheet resistance of approximately 5 to 15 ohms per square. Also in the preferred embodiment, layer 29 is approximately 0.5 to 2 micrometers thick, has a resistivity of approximately $10^{-6}$ to $10^{-5}$ ohm-centimeters, and has a sheet resistance of approximately 0.02 to 0.1 ohms per square. Therefore, layer 28 is thinner, has a higher resistivity, and has a higher sheet resistance than layer 29. Accordingly, portion 23 of gate fingers 21 has a lower resistivity and a lower sheet resistance than portion 24 of gate fingers 21. Thus, portion 24 is a resistor that has via-less contacts with and interconnect layer or portion 23 of gate fingers 21.

Figure 4:
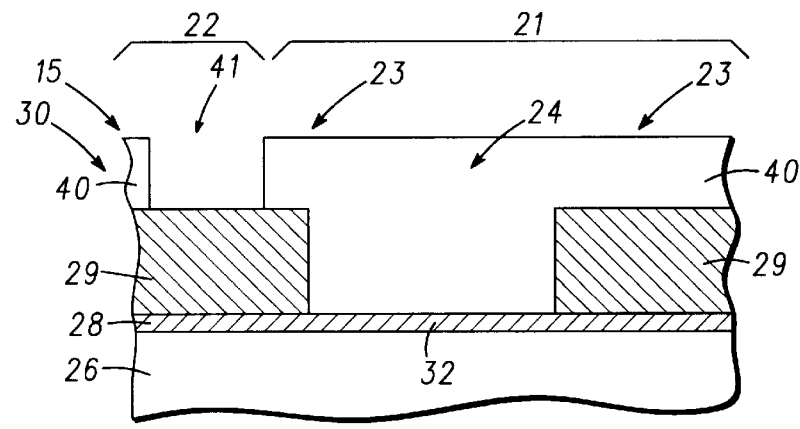
FIG. 4 depicts the cross-sectional view of the semiconductor device of FIG. 3 after subsequent manufacturing in accordance with the present invention.

FIG. 4 depicts the cross-sectional view of device 10 in FIG. 3 after subsequent manufacturing. A dielectric layer 40 is disposed over and physically contacts layers 28 and 29 of gate electrode 15. In particular, layer 40 is formed over portion 24 of gate fingers 21 and portion 32 of layer 28. Layer 40 can be a final passivation layer, or layer 40 can alternatively be a dielectric layer located between adjacent interconnect layers wherein bus 22 could form a first interconnect layer. Layer 40 has a via 41 overlying bus 22. Via 41 is absent over portion 24 of gate fingers 21.

Figure 5:
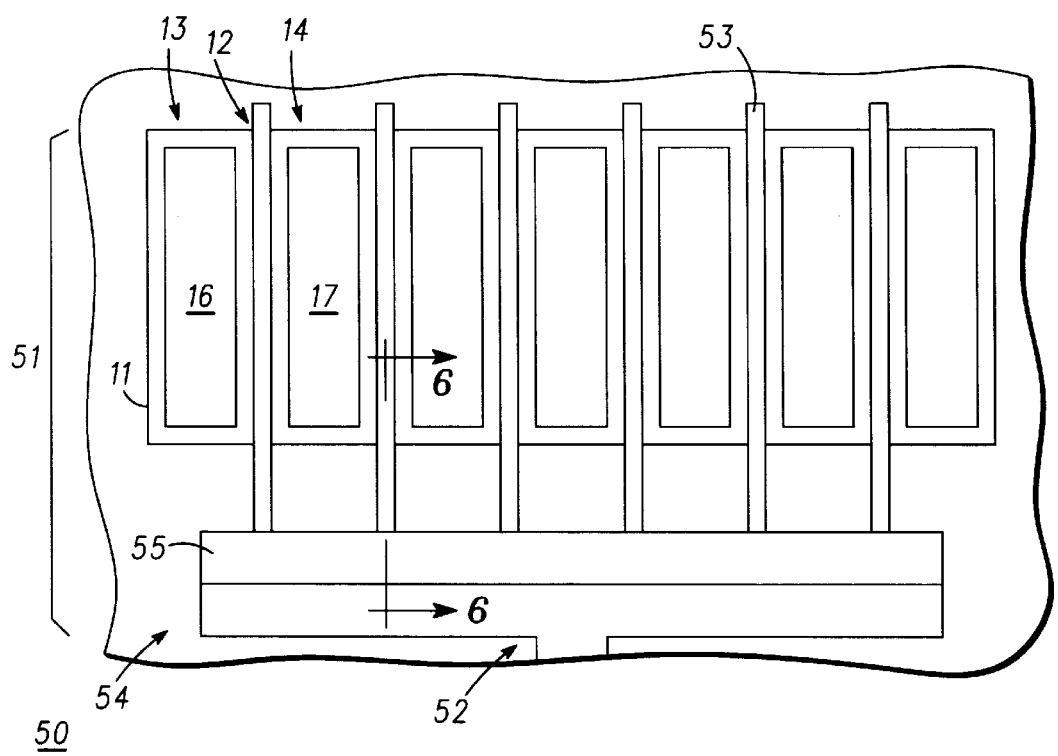
FIG. 5 illustrates a partial plan view of an alternative embodiment of the semiconductor device of FIG. 1 after an intermediate stage of manufacturing in accordance with the present invention.

FIG. 5 illustrates a partial plan view of an electronic component or semiconductor device 50 after an intermediate stage of manufacturing. Device 50 is an alternative embodiment of device 10 in FIG. 1. The same elements are identified by the same references numbers in the drawings.

Device 50 includes a gate electrode 52, which is similar to gate electrode 15 in FIG. 1. Electrode 52 has gate fingers 53 coupled to a gate bus 54. Gate fingers 53 are similar to gate fingers 21 of FIG. 1, except that gate fingers 53 do not have a built-in resistor. Gate bus 54 is similar to gate bus 22 of FIG. 1, except that gate bus 54 has a built-in resistor portion 55.

Figure 6:
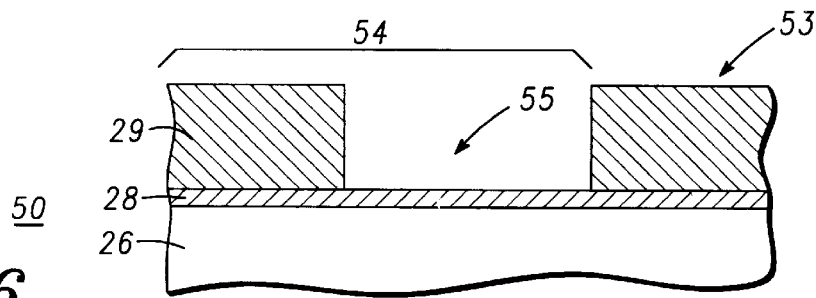
FIG. 6 represents a cross-sectional view of the semiconductor device of FIG. 5 taken along a section line 6—6.

FIG. 6 represents a cross-sectional view of device 50 taken along a section line 6—6 in FIG. 5. Gate fingers 53 have a single thickness while gate bus 54 has two thicknesses. Portion 55 of gate bus 54 has the smaller thickness compared to the remaining portions of gate bus 54. Transistor 30 of FIGS. 1, 2, 3, and 4 is preferred over transistor 51 of FIGS. 5 and 6 because ballasting each individual gate finger produces a more stable high performance transistor.

The concept of a built-in resistor presented herein can be extended to other portions of an integrated circuit. For example, a built-in resistor can be used with the source, drain, emitter, base, or collector of a transistor. As another example, the built-in resistor can be manufactured by using only a single layer or more than two layers of electrically conductive material, instead of the two electrically conductive layers presented herein. As a further example, a thin film metal resistor can be integrated into a second or third layer of metal in a multi-level interconnect scheme. In other words, the resistor can be formed from a thinner portion of the second or third interconnect layer. If used with the first layer of interconnect, this alternative embodiment can also be used to form a layer of interconnect having a via-less contact with a resistor and also having a via-less contact with a transistor. Accordingly, via-less contact resistors provides more flexibility in designing integrated circuits and also enables the production of smaller semiconductor die.

Therefore, an improved semiconductor device is provided that overcomes the disadvantages of the prior art. The use of an integrated gate resistor improves the stability of the semiconductor device. The use of an integrated gate resistor does not require any additional space within the semiconductor substrate and also does not require the use of new materials or new process steps. Therefore, the semiconductor device presented herein is no more expensive or difficult to manufacture than the prior art devices. Additionally, the integrated gate resistor described herein is well-suited for applications where an external gate resistor must be in close physical proximity to the gate electrode of a transistor.

What is claimed is:

1. A semiconductor device comprising:
   a semiconductor substrate;
   a first layer located over the semiconductor substrate wherein the first layer is electrically conductive and has a first resistivity, wherein the first layer has a first portion, a second portion adjacent to the first portion, and a third portion adjacent to the second portion, and wherein the second portion electrically couples the first portion to the third portion;

a second layer having a second resistivity lower than the first resistivity wherein a first portion of the second layer is located on the first portion of the first layer, wherein a second portion of the second layer is located on the third portion of the first layer, wherein the second layer is devoid of covering the second portion of the first layer; and a transistor supported by the semiconductor substrate wherein the first and second layers form a gate electrode for the transistor, wherein the gate electrode comprises:
  a gate feed network; and
  gate finders coupled to the gate feed network, and
wherein the gate feed network comprises the second portion of the first layer.

2. The semiconductor device of claim 1 further comprising a dielectric layer overlying the second portion of the first layer wherein the dielectric layer is absent between the first and second layers.

3. The semiconductor device of claim 1 wherein the first layer forms a Schottky contact with the semiconductor substrate.

4. The semiconductor device of claim 1 wherein the transistor includes an active area in the semiconductor substrate wherein the second portion of the first layer is absent over the active area.

5. The semiconductor device of claim 1 wherein one of the gate fingers comprise the second portion of the first layer.

6. The semiconductor device of claim 1 wherein the second portion of the first layer is a resistor, wherein the first portion of the first layer and the first portion of the second layer form an interconnect layer, and wherein the interconnect layer has a via-less contact with the resistor.

7. An electronic component comprising a transistor with a gate electrode wherein a first portion of the gate electrode has a first thickness, wherein a second portion of the gate electrode has a second thickness smaller than the first thickness, wherein the first portion has a lower resistivity than the second portion, and wherein the gate electrode comprises:

a bus;
  a first finger substantially perpendicular and electrically coupled to the bus; and
  a second finger substantially perpendicular and electrically coupled to the bus, wherein the bus comprises the first and second portions of the gate electrode and wherein the first and second fingers comprise the first portion of the gate electrode.

8. The electronic component of claim 7 wherein the bus comprises the first portion of the gate electrode and wherein the first and second fingers each comprise the first and second portions of the gate electrode.

9. The electronic component of claim 7 further comprising a dielectric layer overlying and physically contacting the gate electrode wherein the dielectric layer has a via and wherein the via is absent over the second portion of the gate electrode.

10. The electronic component of claim 7 wherein the first thickness is approximately five to twenty times greater than the second thickness.

11. The electronic component of claim 10 wherein the transistor comprises a channel region wherein the first portion of the gate electrode is located over the channel region and wherein the second portion of the gate electrode is absent over the channel region.

12. An electronic component comprising:
  a transistor with a gate electrode wherein a first portion of the gate electrode has a first thickness, wherein a second portion of the gate electrode has a second thickness smaller than the first thickness, and wherein the first portion has a lower resistivity than the second portion; and
  a dielectric layer overlying and physically contacting the gate electrode wherein the dielectric layer has a via and wherein the via is absent over the second portion of the gate electrode,
wherein the transistor further comprises a channel region, wherein the first portion of the gate electrode is located over the channel region, and wherein the second portion of the gate electrode is absent over the channel region,
wherein the rate electrode comprises:
  a bus,
  a first finger substantially perpendicular and electrically coupled to the bus; and
  a second finger substantially perpendicular and electrically coupled to the bus, and
wherein the bus comprises the first and second portions of the gate electrode and wherein the first and second fingers comprise the first portion of the gate electrode.

13. The electronic component of claim 12 wherein the bus comprises the first portion of the gate electrode and wherein the first and second fingers each comprise the first and second portions of the gate electrode.

* * * * *